United States Patent [19]

Koyanagi

[11] 4,139,852

[45] Feb. 13, 1979

[54] WHIP-TYPE ANTENNA WHICH CAN SLIDE-ADJUST THE TUNING FREQUENCY

[76] Inventor: Joji Koyanagi, 575, Oaza Yaemizo, Nabeshima-machi, Saga-shi, Saga-ken, Japan

[21] Appl. No.: 825,349

[22] Filed: Aug. 17, 1977

[51] Int. Cl.² .............................................. H01L 1/10

[52] U.S. Cl. .................................... 343/903; 343/750

[58] Field of Search ................ 343/750, 749, 711–715, 343/889, 900–903

[56] References Cited

U.S. PATENT DOCUMENTS 3,671,972 6/1972 Spilsbury et al. .................... 343/750

*Primary Examiner*—Alfred E. Smith
*Assistant Examiner*—David K. Moore
*Attorney, Agent, or Firm*—Frank J. Jordan

[57] ABSTRACT

In a whip-type antenna which can be used for either mobile or fixed station, the improvement is characterized in that the antenna has at least a portion of an antenna element thereof wound in turns so as to impart the inductance to the antenna element and a power-operated motor is capable of varying the turns and pitches of the above wound antenna element for varying the inductance, which leads to the variation of tuning frequency of the antenna.

6 Claims, 8 Drawing Figures

WHIP-TYPE ANTENNA WHICH CAN SLIDE-ADJUST THE TUNING FREQUENCY

BACKGROUND OF INVENTION

This invention relates to a radio antenna of either mobile or fixed station which provides a remote control of a tuning frequency that the antenna receives or transmits.

These days, the number of cars which are equipped with radio systems has remarkably increased. Those systems available for amateur radio operators have particularly increased in number and accordingly the radio technique in the amateur radio field has shown a remarkable progress such that the radio system has become compact and shown improved performance. Eventually this improvement has led to the advent of a radio system, which has a number of bands, yet can be mounted onto a vehicle.

In view of the above situation an improvement also has been requested in view of antenna which preferably can cover a number of bands with a single antenna element thereof.

The following types of antennas have been popularly used as antennas which can cover a number of bands:

(a) a whip-type antenna which is provided with replaceable inductance coil at the middle thereof, (b) a whip-type antenna having a variable inductance coil at the middle thereof wherein inductance of the coil is variable manually or by a power-operated motor, and (c) a whip-type antenna having three kinds of inductance coils at the middle of the whip antenna.

However, these antennas are less than optimal in their performance and appearance due to the constructional restriction set forth above. Namely, in view of the performance of above whip-type antennas, the variation of inductance which corresponds to the variation of tuning frequency has been conducted either by the replacement of the inductance coil or the inductance variation of the short coil attached to the middle of the antenna so that the tuning frequency that such antennas can cover is defined to a limited range and the replacing operation is cumbersome.

Accordingly, it is an object of the present invention to provide a whip-type antenna which can vary the tuning frequency in a wide range overcoming the defects of conventional whip-type antenna.

It is another object of the present invention to provide a whip-type antenna which is characterized in that the tuning frequency of the whip antenna is varied corresponding to the variation of turns or pitch of loading (inductance) coils which is conducted by a power-operated motor.

Although the invention is illustrated and described in relationship to specific embodiments, it is nevertheless not intended to be limited to the details shown, since various modifications and structural changes may be made therein without departing from the spirit of the invention and within the scope and range of equivalents of the claims.

The construction and operation of the invention, however, together with additional objects and advantages, thereof, will be best understood from the following description of specific embodiments when read in connection with the accompanying drawings.

DETAILED DESCRIPTION OF DISCLOSURE

The whip-type antenna of this invention is described hereinafter in the following embodiments in conjunction with attached drawings.

FIRST EMBODIMENT

Figure 1:
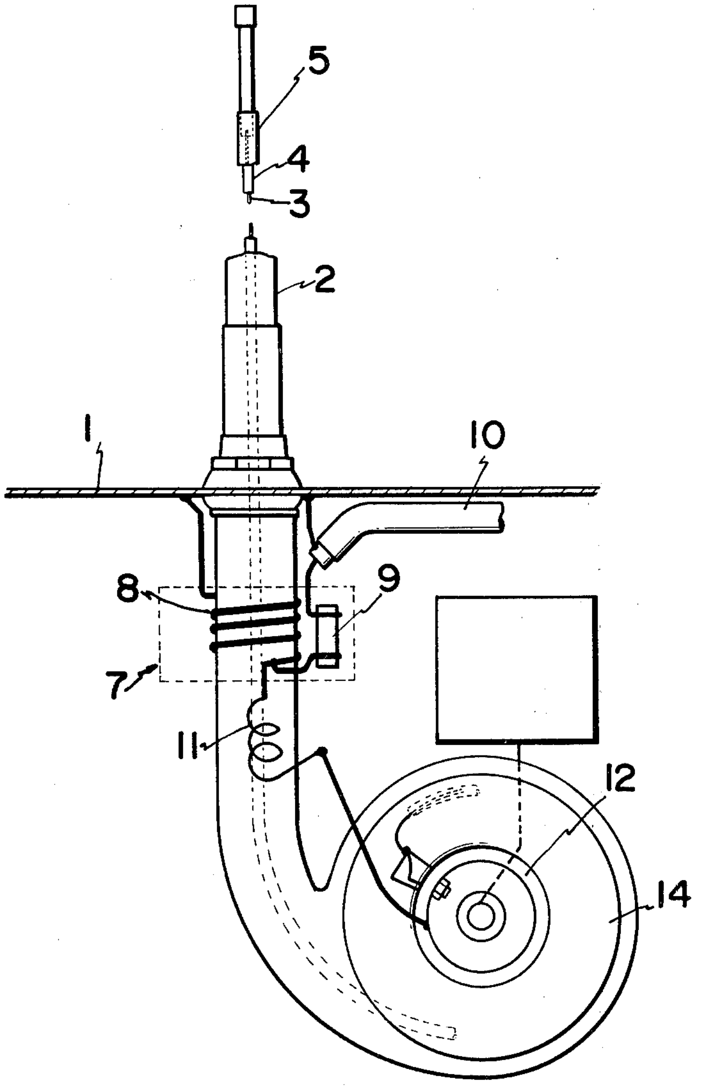
FIG. 1 is schematic view of the whip-type antenna of the first embodiment showing especially the wiring of the device.
Figure 2:
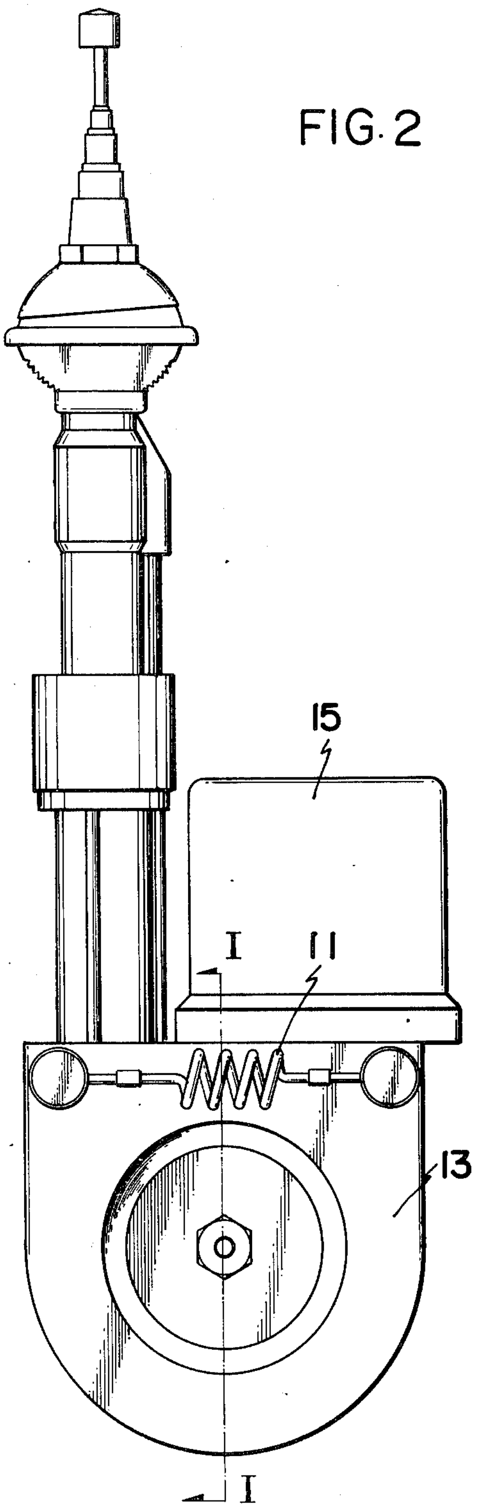
FIG. 2 is a front view of the above antenna.

In FIG. 1, a rod antenna 2 which can be extended or retracted in a telescopic manner is mounted on a metallic body 1 of a vehicle such that the proximal end of the antenna 2 is secured to the metallic body 1. Within the rod antenna 2, an antenna element or conductor 3 which is extruded in a flexible insulating tube 4 of high material strength (preferably made of polyacetal) is suitably disposed in a concentric manner having the upper extremity thereof secured to the top 5 of the rod antenna 2.

This antenna element 3 has at least the lower portion reeled into a reel casing 6, the construction of which is described later in detail.

Due to the above construction, the antenna element 3 can be either raised or lowered corresponding to the elevation of the rod antenna 2.

A matching circuit 7 which comprises a matching coil 8 and a matching condenser 9 is disposed just below the proximal end of the antenna 2 and within the metallic body 1. This matching condenser 9 has one end connected with one corresponding end of a feeder 10 which, in turn, has another end connected with either a radio transmitting or receiving device (not shown in the drawings).

Figure 3:
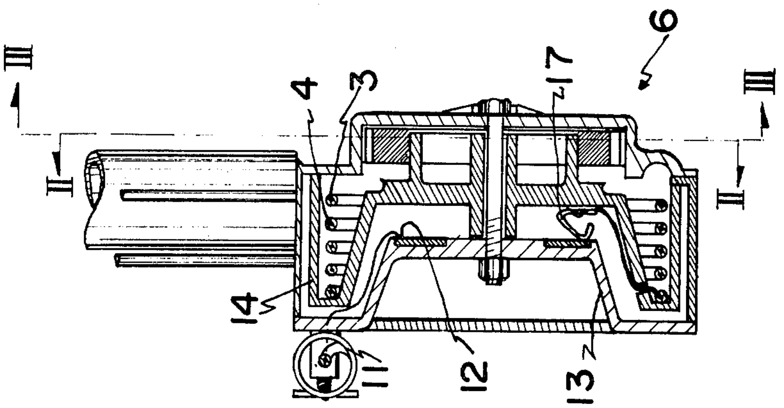
FIG. 3 is a cross-sectional view of FIG. 2 taken along the line I—I.
Figure 4:
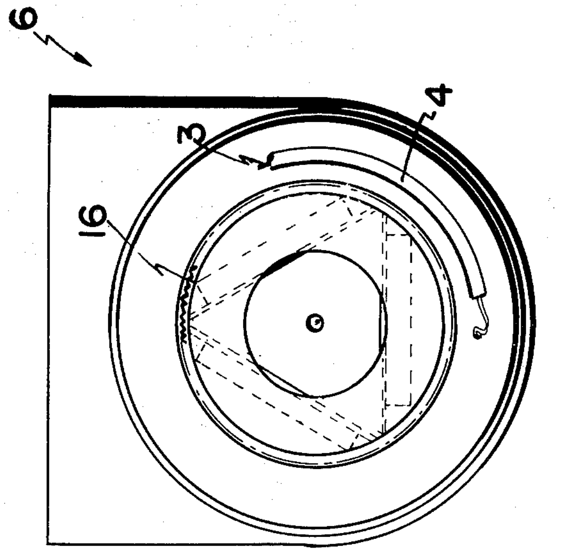
FIG. 4 is a cross-sectional view of FIG. 3 taken along the line II—II.
Figure 5:
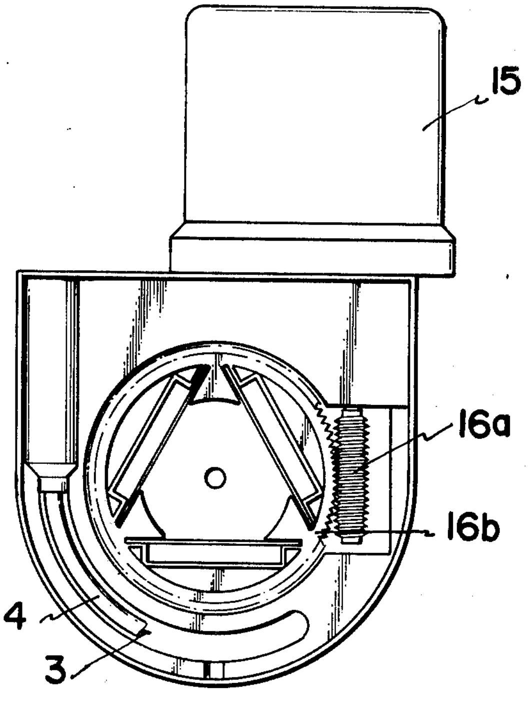
FIG. 5 is a cross-sectional view of FIG. 3 taken along the line III—III, wherein one side of the drive casing is eliminated for clarifying the drawing.

The above condenser 9 has another end connected with the corresponding end of the above matching coil 8 as well as the corresponding end of an auxiliary coil 11. This auxiliary coil 11 has another end connected with a slide ring 12 which is fixedly secured to the inner periphery of a reel cover 13 which is made of an insulating material and forms a part of the reel casing 6. (Please refer to FIG. 3)

Referring now to the reel casing 6, the above flexible antenna element 3 has some portion thereof wound like a coil in a drive reel 14 which is driven by a power-operated motor 15 by way of a worm 16*a* and a worm wheel 16*b*. This antenna 2 is further constructed such that the antenna element 3 has one end thereof provided with a brush 17 which biasingly and slidably come in contact with the slide ring 12 and has other end secured to the inner extremity 2 of the rod antenna element 3 as described before.

Referring now to the operation of the whip antenna of this invention which has the above construction, the current of high frequency carried from the transmitter reaches the slide ring 12 by way of the feeder 10, the matching circuit 7 and the auxiliary coil 11. Thus carried high frequency current is further carried to the antenna element 3 by way of a slide engagement between the stationary slide ring 12 and the rotatable brush terminal 17 which is disposed in the drive wheel 14. When the antenna element 3 is reeled into the drive reel 14 by means of the power-operated motor 15, the inductance L of the reeled antenna element 3 becomes larger and correspondingly the tuning frequency of the entire antenna becomes lower. When the antenna element 3 is reeled out from the drive wheel 14, the above inductance decreases and the tuning frequency becomes higher. This implies that a desired matching point or frequency is obtainable by adjusting the reeling amount of the antenna element 3 which is imparted by the actuation of the power-operated motor 15.

Since the variation of the inductance caused by the reeling of the antenna element in or out from the drive reel 14 is far greater than the variation of inductance caused by either extension or retraction of the antenna element 7, the tuning frequency moves toward higher frequency corresponding to the extension of the rod antenna 2. In this first embodiment, the tuning frequency could be continuously varied from 18 MHZ to 29 MHZ.

Furthermore the whip-type antenna of this invention is provided with following additional constructions which feature the above antenna.

Namely, the auxiliary coil 11 which is disposed between the matching circuit 7 and the reel 14 is replaceably mounted. Therefore, with the provision of various kinds of coils 11 which differ in diameter, pitch or total length with each other the adjustment of tuning frequency band is achieved.

Meanwhile, since the whip-type antenna(rod antenna) of this embodiment is constructed in a telescopic manner, the entire antenna can be substantially hidden into the car body 1 when the antenna is retracted to the lowest position, the antenna be prevented from steal or damage.

Accordingly, the whip-type antenna of this embodiment has the following advantages.

(i) A single antenna can cover a multiple number of bands.

(ii) Since the rod antenna is made of a telescopic construction, the rod is almost hidden in the vehicle body when it is retracted to the lowest level whereby the aesthetic effect of the vehicle equipped with such antenna cannot be damaged.

SECOND EMBODIMENT

The whip-type antenna of this embodiment is devised from the idea that if the tuning frequency can be varied merely by the manipulation of the drive reel 14 while maintaining the height of the rod antenna 2 at a constant level, the tuning frequency varies in a range much wider than that of the first embodiment. As can be observed easily from FIG. 6, the vehicle body 1, a power-operated mechanism 15, a reeling mechanism 14 and a feeding circuit 10 of the antenna of this embodiment correspond to those of the first embodiment.

The improvement which characterizes this second embodiment is that a rod antenna 18 of a metallic pipe construction is mounted on the vehicle body in place and a flexible antenna element 19 is elevatably disposed relative to and in the rod antenna 18. This element 19 is further provided with a contactor 20 which slidably comes into contact with the inner periphery of the metal-made rod antenna 18.

To be more specific, the above contactor 20 which has the equidistant longitudinal slits biasingly comes into contact with the inner side of the rod antenna 18 and is slidable within the rod antenna 18 while maintaining above contact engagement. The contactor 20 is secured to the top extremity of the antenna element 19 preferably by soldering.

Due to the above construction, the above contactor 20 elevates or goes down corresponding to the reeling-out or reeling-in of the antenna 18 relative to the drive reel 14. Accordingly, the rod antenna 18 maintains the constant length irrespective of the elevation of antenna element 19 so that the tuning frequency is greatly varied corresponding to the number of turns or diameter of turns of the antenna element 19 wound in the drive reel 14.

The operating principle set forth in the above embodiment is applicable not only to mobile stations such as vehicles but also fixed stations.

Namely, the vehicle body is replaceable with a steel tower.

Figure 7:
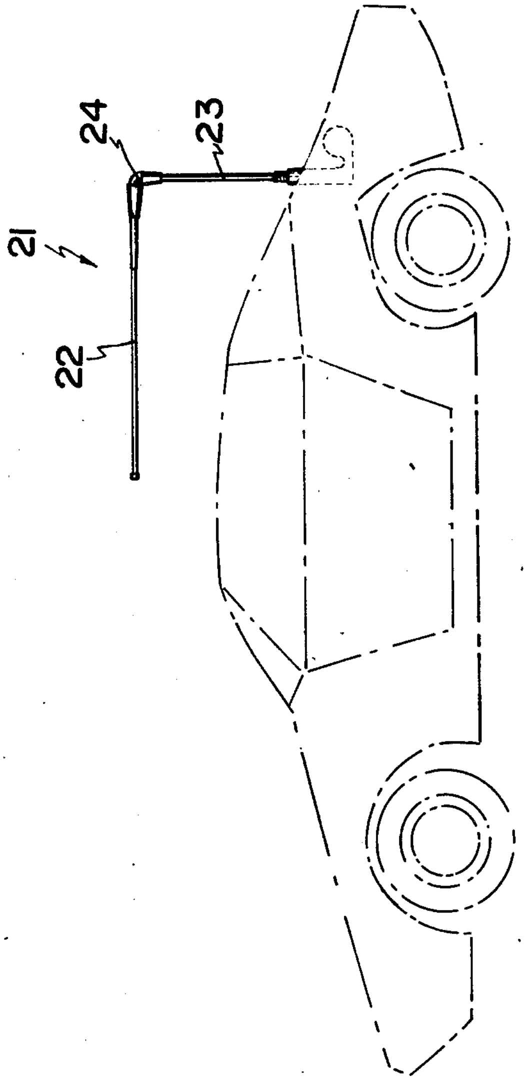
FIG. 7 is a schematic view of the modification of the above antenna which is characterized by a junction which connects the upper and lower portion of the rod antenna.
Figure 8:
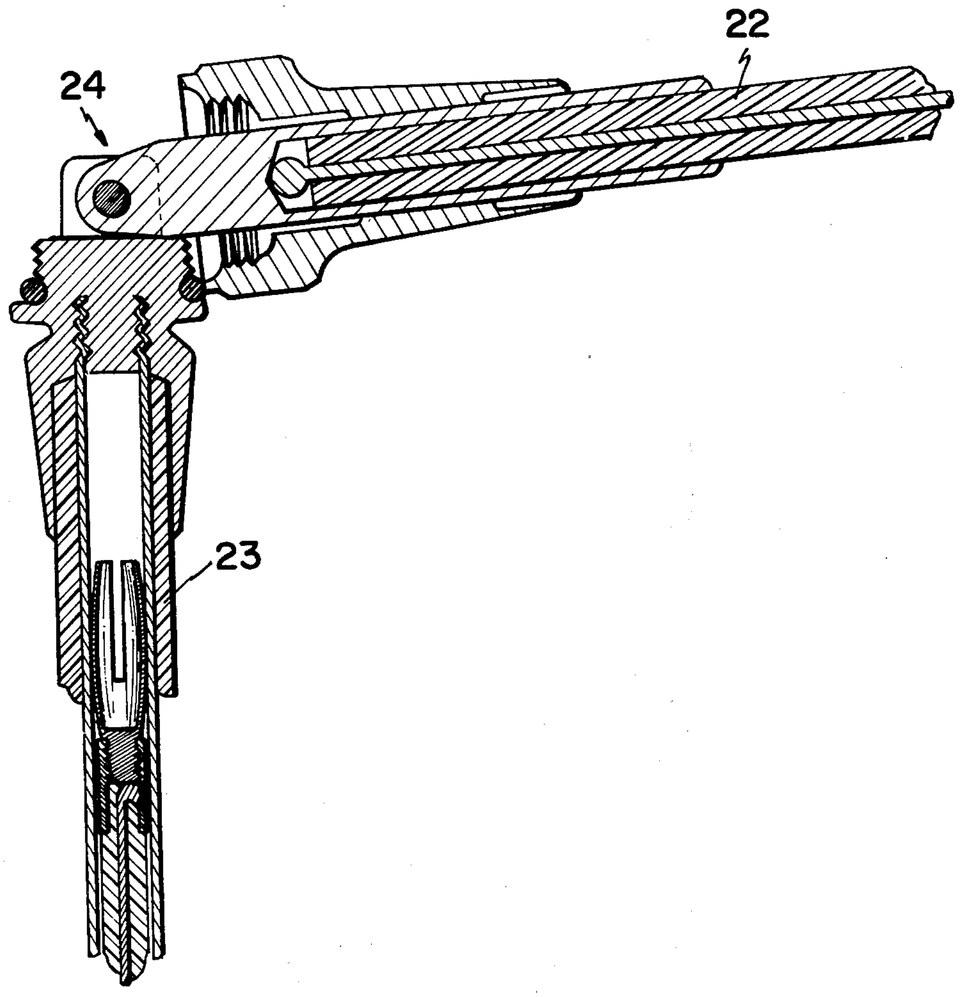
FIG. 8 is an enlarged cross-sectional view of the above junction.

FIG. 7 shows the modification of above whip-type antenna wherein the improvement is characterized in that the rod antenna 21 comprises an upper portion 22 and a lower portion 23 which are connected by a junction 24.

Figure 6:
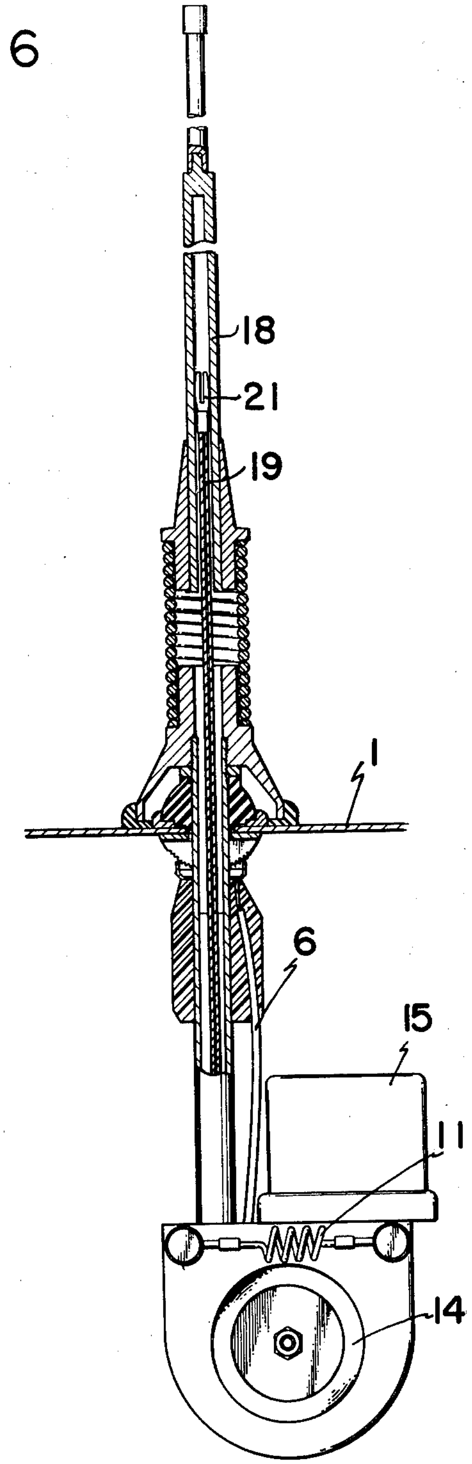
FIG. 6 is a front view with a part broken away of the whip-type antenna of the second embodiment.

Depending upon the wave length of the radio wave to be received ot transmitted, the antenna of a considerable length may be required. This modified antenna is especially applicable in such a case wherein the antenna can be bent as shown in FIG. 6 when it is out of operation.

What we claim is:

1. Whip-type antenna which can slide-adjust the tuning frequency comprising:

(a) a rod antenna of a telescopic construction mounted substantially vertically on a vehicle body having a proximal end thereof secured to said body, (b) an antenna element extruded in a flexible insulating tube, which has a considerable portion disposed in said rod antenna, said antenna element having an upper extremity thereof secured to the top of said rod antenna such that said antenna element moves upwardly or downwardly corresponding to the elevation of said rod antenna, (c) a drive reel rotatably encased in a reel casing which is disposed below said vehicle body, said reel having a portion thereof connected with a lower end of said antenna element for winding said antenna element around said drive reel to generate the impedance in said antenna element, (d) a matching circuit having one terminal connected to said wound end of said antenna element, (e) a feeder having one end connected to a radio transmitting or receiving station and the other end connected with said matching circuit, and (f) an auxiliary coil for fine-adjusting said tuning frequency of the antenna replaceably disposed between said matching circuit and the wound end of said antenna element, whereby, corresponding to the rotation of said drive reel, said impedance of the wound atenna element varies and accordingly the tuning frequency of said whip-type antenna as a whole is variable in a wide range.

2. Whip-type antenna according to claim 1, wherein said matching circuit consists of a matching coil and a matching condenser, said matching condenser having one end connected with said feeder and another end connected with one end of said matching coil and one end of said auxiliary coil.

3. Whip-type antenna according to claim 2, wherein said auxiliary coil has one end connected with a slide ring secured to said rotatable drive reel and said antenna element has another end provided with a brush which slidably comes into contact with said slide ring.

4. Whip-type antenna which can slide-adjust the tuning frequency comprising:

(a) a rod antenna of a solid construction mounted substantially vertically on a vehicle body having a proximal end thereof secured to said body, (b) an antenna element extruded in a flexible insulating tube, which has a considerable portion disposed in said rod antenna, said antenna element having an upper extremity thereof provided with a contactor which slidably comes into contact with the inner surface of said rod antenna such that said contactor moves upwardly or downwardly within and relative to said stationary rod antenna, (c) a drive reel rotatably encased in a reel casing which is disposed below said vehicle body, said reel having a portion thereof connected with a lower end of said antenna element for winding said antenna element around said drive reel to generate the impedance in said antenna element, (d) a matching circuit having one terminal connected to said wound end of said antenna element, (e) a feeder having one end connected to a radio transmitting or receiving station and the other end connected with said matching circuit, and (f) an auxiliary coil for fine-adjusting said tuning frequency of the antenna replaceably disposed between said matching circuit and the wound end of said antenna element, whereby, corresponding to the rotation of said drive reel, said impedance of the wound antenna element varies and accordingly the tuning frequency of said whip-type antenna as a whole is variable in a wide range.

5. Whip-type antenna according to claim 4, wherein said matching circuit consists of a matching coil and a matching condenser, said matching condenser having one end connected with said feeder and another end connected with one end of said matching coil and one end of said auxiliary coil.

6. Whip-type antenna according to claim 5, wherein said auxiliary coil has one end connected with a slide ring secured to said rotatable drive reel and said antenna element has another end provided with a brush which slidably comes into contact with said slide ring.

* * * * *